US007188205B2

(12) United States Patent
Le et al.

(10) Patent No.: US 7,188,205 B2
(45) Date of Patent: Mar. 6, 2007

(54) MAPPING OF HOT-SWAP STATES TO PLUG-IN UNIT STATES

(75) Inventors: Tuan A. Le, San Jose, CA (US); Christopher J. Rinaldo, San Jose, CA (US); Angshuman Mukherjee, Fremont, CA (US); Vinh H. Truong, San Jose, CA (US); Daniel Delfatti, Belmont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 325 days.

(21) Appl. No.: 10/690,121

(22) Filed: Oct. 20, 2003

(65) Prior Publication Data

US 2004/0117431 A1 Jun. 17, 2004

Related U.S. Application Data

(60) Provisional application No. 60/420,850, filed on Oct. 24, 2002.

(51) Int. Cl.
*G06F 13/00* (2006.01)
(52) U.S. Cl. .................... 710/300; 710/301; 710/302
(58) Field of Classification Search ........... 710/100, 710/300–302, 105, 110, 305
See application file for complete search history.

(56) References Cited

U.S. PATENT DOCUMENTS

| 6,026,458 A | 2/2000 | Rasums |
| 6,145,099 A | 11/2000 | Shindon |
| 6,260,092 B1 | 7/2001 | Story et al. |
| 6,324,485 B1 | 11/2001 | Ellis |
| 6,591,324 B1 | 7/2003 | Chen et al. |
| 2002/0158770 A1* | 10/2002 | Ahmed et al. ........... 340/686.4 |
| 2003/0033464 A1* | 2/2003 | Larson et al. ............... 710/302 |
| 2005/0080971 A1* | 4/2005 | Brand ........................ 710/302 |

OTHER PUBLICATIONS

Software Development Library: quickComm, Spectrum Signal Processing, Jun. 2003.*
TechOnLine: Part 3: Inplementing High Availability CompactPCI.*

(Continued)

*Primary Examiner*—Khanh Dang
(74) *Attorney, Agent, or Firm*—Meyertons Hood Kivlin Kowert & Goetzel, P.C.; B. Noël Kivlin

(57) ABSTRACT

A Compact Peripheral Component Interconnect (CPCI) system is provided that can map PCI Industrial Computer Manufactures Group (PICMG) states describing the state of a hot-swap CPCI card into Telecommunication Management Network (TMN) plug-in unit states. Specifically, the hardware/Operating System (OS) states for the CPCI card are specified in PICMG states in accordance with the PICMG hot-swap specification. The present system identifies or defines the meaning (e.g., the definition, identification, function, and/or status) of the states on the CPCI card. The system then maps these states into intermediate states. The intermediate states are then mapped into TMN plug-in unit states (e.g., OperationalState and/or AvailiableStatus). The TMN plug-in unit states corresponding to the CPCI card will then comprise the proper identification information for the CPCI card. Accordingly, a management ware having plug-in units based on the TMN standard can now use these mapped states to manage the state (or status) of the CPCI card.

23 Claims, 6 Drawing Sheets

OTHER PUBLICATIONS

Ten Ingredients for Selecting HA Middleware, CommsDesign, Jun. 2001.*
Implementing the HIP1011 on Hot Swap CPCI Boards for High Availability (HA) Platforms, Intersil, Aug. 2000.*
Highly Availability Networking, Linux Journal, Jan. 2002.*
CompactPCI, PCI Industrial Computer Manufacturers Group (PICMG).*
An Introduction to TMN, Shrewsbury, 1995.*
Hot Swap in CompactPCI Systems, Motorola Computer Group.*

* cited by examiner

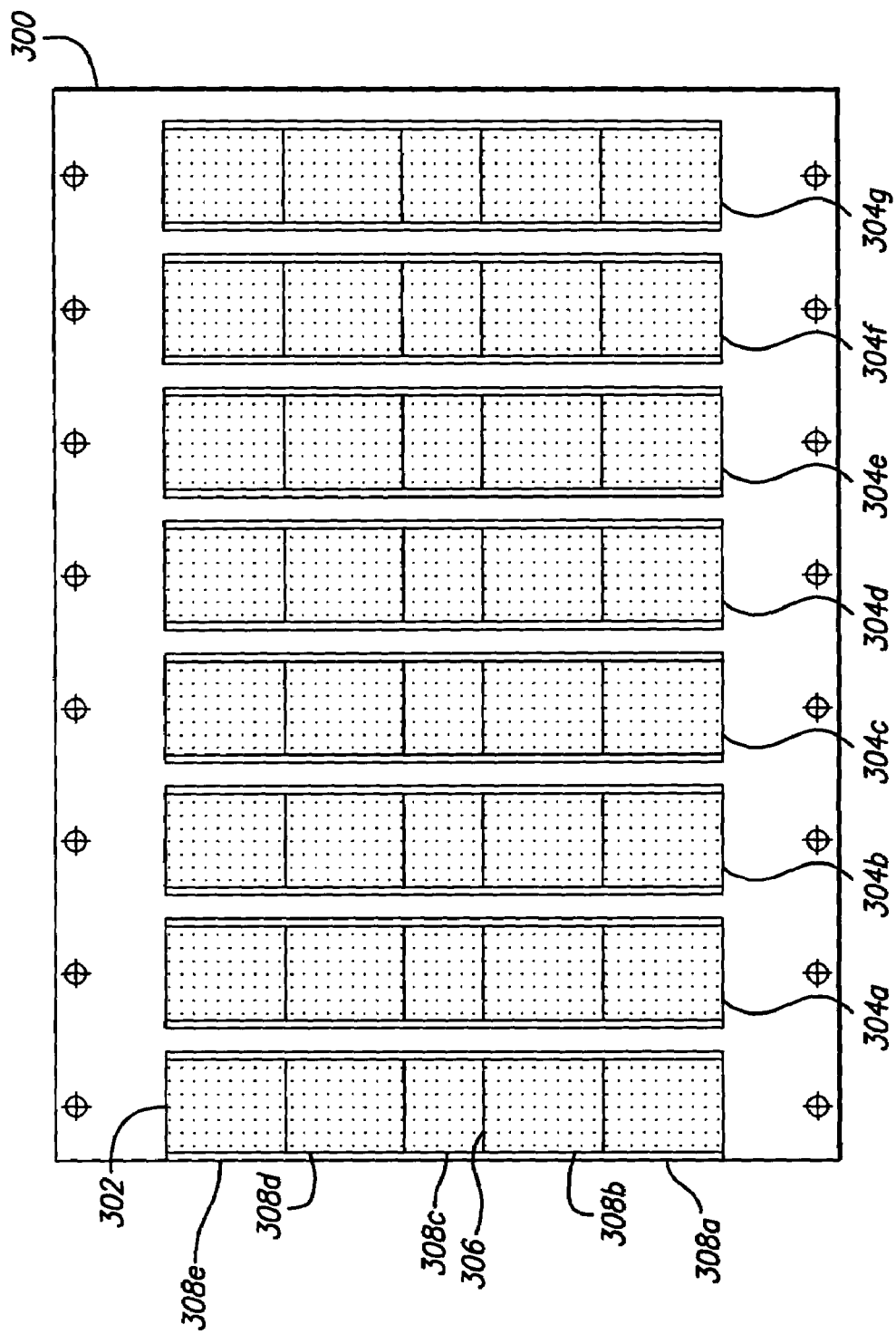

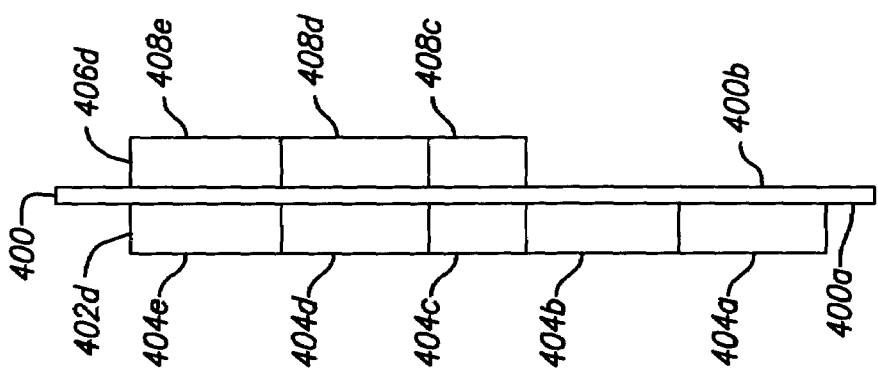
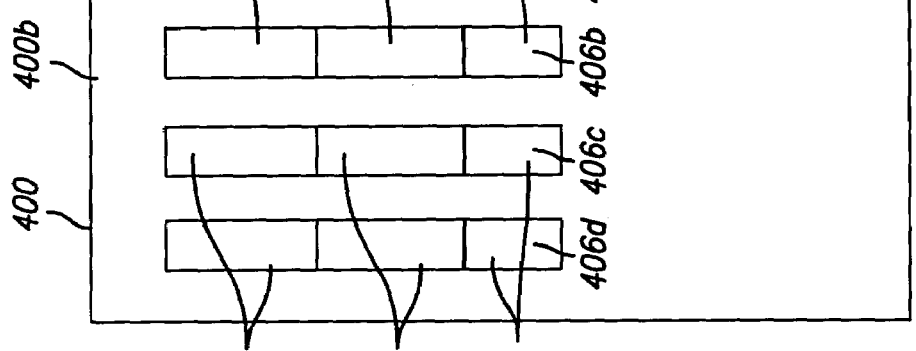
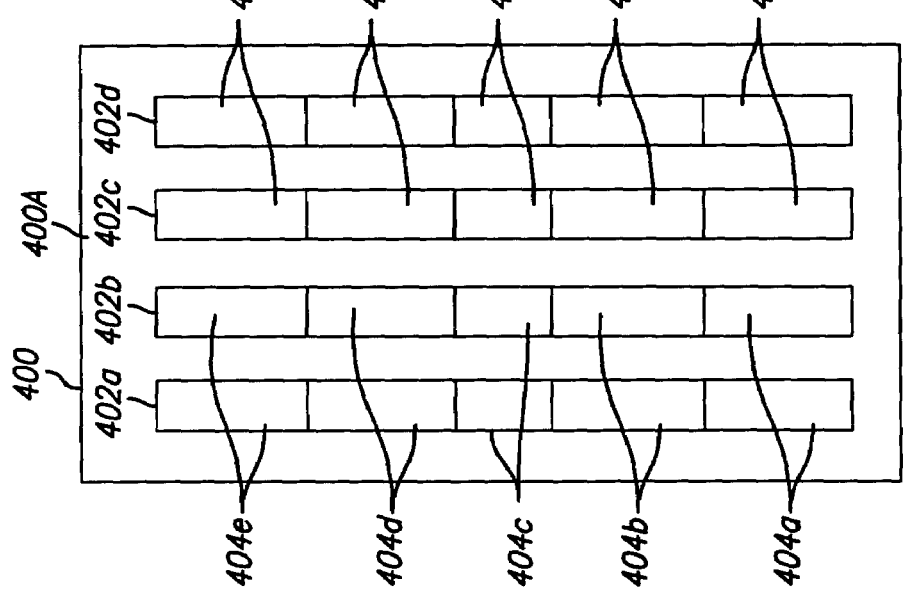

MAPPING OF HOT-SWAP STATES TO PLUG-IN UNIT STATES

RELATED APPLICATION DATA

This application claims priority pursuant to 35 U.S.C. §119(e) to U.S. Provisional Application No. 60/420,850, filed Oct. 24, 2002, for Mapping of Hot Swap States of PICMG to TMN Plug-In Units.

BACKGROUND OF THE INVENTION

1. Field of the Invention

The present invention relates to computer systems and the like, and more particularly, to a system and method for mapping hot swap states from one system to another.

2. Description of Related Art

A computer platform can be designed with a variety of implementations/architectures that are either defined within existing standards, for example the PCI Industrial Computer Manufacturers Group (PICMG) standards, or can be customized architectures. For example, a computer platform can be designed with a Compact Peripheral Component Interconnect (CPCI). The CPCI is a high performance industrial bus based on the standard PCI electrical specification in rugged 3U or 6U Eurocard packaging. CPCI is intended for application in telecommunications, computer telephony, real-time machine control, industrial automation, real-time data acquisition, instrumentation, military systems or any other field requiring high-speed computing, modular and robust packaging design, and long-term manufacturer support. Because of its high speed and bandwidth, the CPCI bus is particularly well suited for many high-speed data communication applications, such as server applications.

Compared to a standard desktop PCI, CPCI supports twice as many PCI slots (typically 8 versus 4) and offers an ideal packaging scheme for industrial applications. Conventional CPCI cards are designed for front loading and removal from a card cage. The cards are firmly held in position by their connector, card guides on both sides, and a faceplate that solidly screws into the card cage. Cards are mounted vertically allowing for natural or forced air convection for cooling. Also, the pin-and-socket connector of the CPCI card is significantly more reliable and has better shock and vibration characteristics than the card edge connector of the standard PCI cards.

Conventional CPCI defines a CPCI backplane that is typically limited to eight slots. More specifically, the bus segment of the conventional CPCI system is limited to eight slots in which node cards (e.g., motherboards or front cards) and mating input/output (I/O) cards (e.g., transition cards) are installed. Typically, the node card provides substantially all features and functions (i.e., clocking, arbitration, configuration, and interrupt processing) of the CPCI system, and the I/O card allows access to these features and functions by providing ports, such as Small Computer System Interface (SCSI) ports.

The newest trend in CPCI systems is to support hot-swappable node and/or I/O cards. Hot-swappability is the ability to unplug and plug cards while the systems are operating. In other words, hot-swappability is the ability to exchange cards while the system is running so that there is no need to shut down and subsequently reboot the system. The PICMG hot-swap/High-Availability (HA) specification (e.g., PICMG 2.0 R3.0 or PICMG 2.1 R2.0), which allows the powering up and down of the card by the hot-swap controller, defines, among other things, that all CPCI slots are controlled individually with states that control the insertion of a hot-swappable card into a slot of the backplane. The states are specified in PICMG specifications. However, if the CPCI cards are to be managed by a management software (or management ware) that has plug-in units based on the Telecommunication Management Network (TMN) standard, these plug-in units cannot use the PICMG states that describe the state of an HA CPCI card. In the context of an embodiment of the present invention, plug-in units are hardware and/or software modules that add specific features or services to a larger system. Accordingly, it would be advantageous to provide a CPCI system that can reliably map the PICMG states of an HA CPCI card into a plurality of operation and available states (or status) for the TMN plug-in units.

SUMMARY OF THE INVENTION

The present invention relates to a CPCI system that is adapted to map hot-swap states from one system to another system.

In one embodiment, a method of mapping a plurality of states for controlling hot-swappablility in a Compact Peripheral Component Interconnect (CPCI) system is provided. The method includes specifying a hot-swap state of a CPCI node card. The hot-swap state is for controlling the hot-swappability of the CPCI node card on the CPCI system. Once the hot-swap state has been specified, the method then maps the hot-swap state onto an intermediate state by searching both a common library associated with the front card and a management software for the front card. Once the hot-swap state has been mapped onto the intermediate state, the method then maps the intermediate state onto a first management state of the management software and a second management state of the management software. The management software requires both the first and second management states to manage the CPCI node card.

In another embodiment, a CPCI system includes a CPCI chassis and a circuit board. The circuit board forms a backplane within the chassis. A CPCI node card is coupled with the circuit board. The node card provides a hot-swap state. A manager manages the CPCI card using a first management state and a second management state. The CPCI system also includes a common library that is associated with the CPCI node card and the manager. The common library provides an intermediate state. The hot-swap state is mapped onto the intermediate state of the common library. The mapped intermediate state is then mapped onto the first and second management states of the manager.

In yet another embodiment, the present invention provides a method and system that maps at least about 8 or 12 PCI Industrial Computer Manufactures Group (PICMG) states describing the state (or status) of a hot-swap CPCI card into Telecommunication Management Network (TMN) plug-in unit states (e.g., the OperationalState and/or AvailiableStatus states.) The mapping or mappings utilize a Common Operating System Library or Layer (COSL). That is, at first, the hardware/Operating System (OS) states for the CPCI card are specified in PICMG states in accordance with the PICMG hot-swap specification. The method and system then identifies or defines (explains or interprets) the meaning (e.g., the definition, identification, function, and/or status) of the states on the CPCI card. The method and/or system then maps these states into intermediate states (e.g., COSL state, plug-in unit state or "plugInUnitState"). The intermediate states are then mapped into TMN plug-in unit states (e.g., OperationalState and/or AvailiableStatus). The TMN plug-in unit states corresponding to the hot-swap CPCI card will then comprise the proper identification information for the hot-swap CPCI card, such as plugInUnitType, vendorName, version, etc. Accordingly, the management software (or management ware or management SW) with plug-in units based on the TMN standard can now use these mapped states to manage the state (or status) of the CPCI card.

More specifically, an embodiment of the present invention is first provided with a hardware/OS state of a hot-swap CPCI card. The hardware/OS state is then mapped into a COSL plugInUnitState (an intermediate state). The COSL plugInUnitState is then mapped into two TMN (e.g., platform independent) states. These two TMN states (e.g., OperationalState and AvaiilabilityStatus) are used by a manager to manage a CPCI node card.

A more complete understanding of the system and method for mapping of hot-swap states to plug-in unit states will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

The drawings illustrate the design and utility of preferred embodiments of the invention. The components in the drawings are not necessarily to scale, emphasis instead being placed upon illustrating the principles underlying the embodiment. Moreover, in the drawings like reference numerals designate corresponding parts throughout the different views.

FIG. 3 is a front view of a backplane having eight slots with five connectors each;

FIG. 4(a) shows a front view of another CPCI backplane;

FIG. 4(b) shows a back view of the backplane of FIG. 4(a);

FIG. 5 shows a side view of the backplane of FIGS. 4(a) and 4(b);

DETAILED DESCRIPTION

The present invention is directed to methods and systems that are adapted to manage the mapping of hot-swap states of a CPCI card from one system to another system.

Embodiments of the present invention can be implemented with CPCI systems that support hot-swappable node and/or I/O cards. The PCI Industrial Computer Manufacturers Group (PICMG) Hot-Swap/High-Availability (HA) specification (e.g., PICMG 2.0 R3.0 or PICMG 2.1 R2.0), which allows the powering-up/down of the card by the hot-swap controller, defines, among other things, that all CPCI slots are controlled individually with states that control the insertion of a hot-swappable card into a slot of the backplane. The states are identified in PICMG specifications. For example, the PICMG hot-swap states, as specified in the Hot-Swap Specification PICMG 2.1, are 12 states describing the state (or status) of a hot-swap CPCI node card (e.g., Central Processing Unit (CPU) card or an Input/Output (I/O) card).

In one embodiment of the present invention, the CPCI node cards are managed by management ware (or management software) with plug-in units based on the Telecommunication Management Network (TMN) standards. The PICMG states (describing the state of an HA CPCI card) are mapped into a plurality of operation states and available states (or status) for the TMN plug-in units. Accordingly, the management ware having the plug-in units based on the TMN standards can now use these mapped states to manage the state (or status) of the HA CPCI card.

Figure 1:
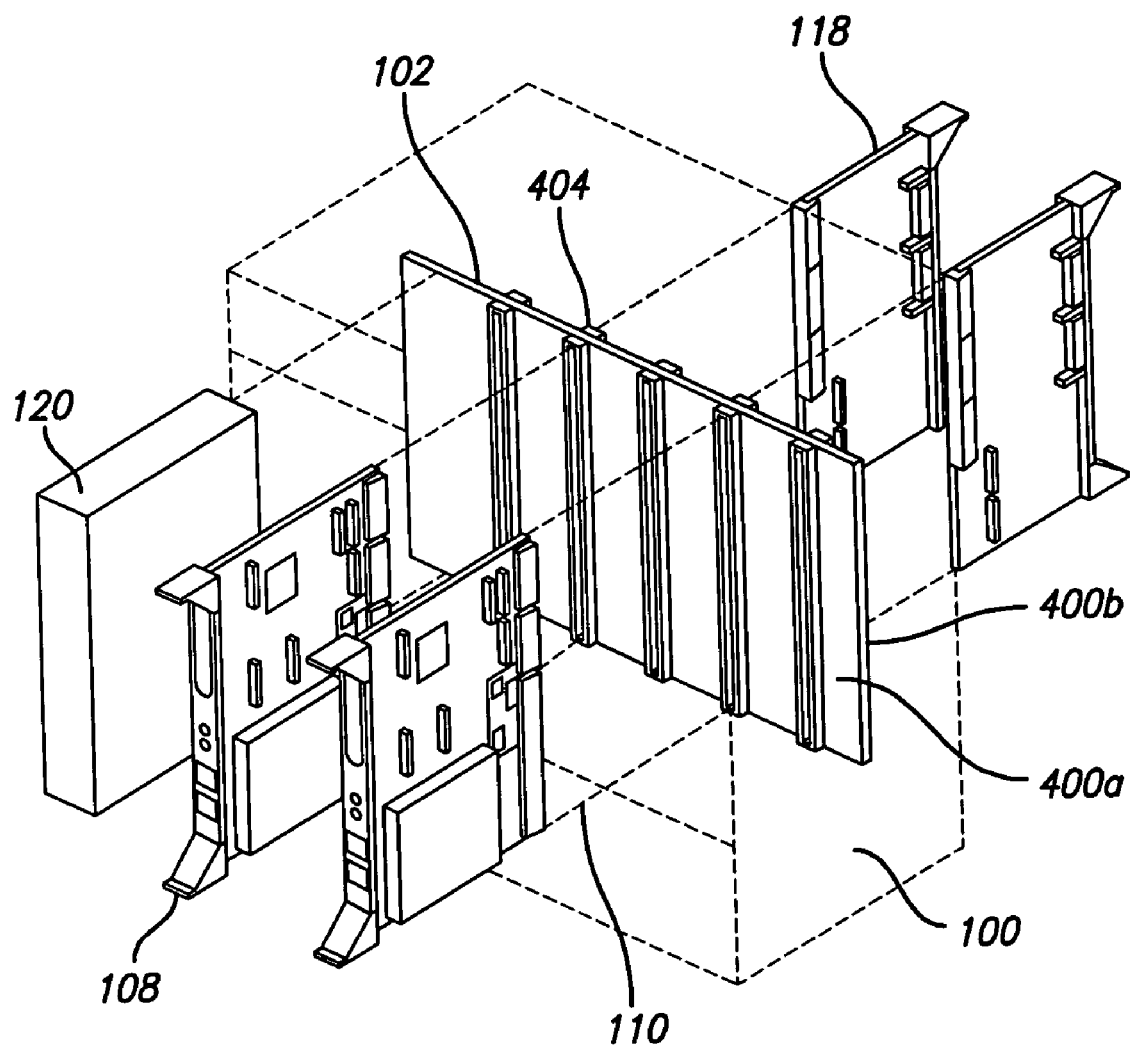
FIG. 1 is an exploded perspective view of a CPCI chassis system according to an embodiment of the invention.

Referring to FIG. 1, there is shown an exploded perspective view of a CPCI chassis system as envisioned in an embodiment of the present invention. The chassis system 100 includes a CPCI circuit board referred to in the conventional CPCI system as a passive backplane (or centerplane) 102 since the circuit board is located at the back of the chassis 100 and front cards (e.g., motherboards) are inserted from the front of the chassis 100. The front side 400a of the backplane 102 has slots provided with connectors 404. A corresponding transition card 118 may also be coupled to the front card 108 via backplane 102. The backplane 102 contains corresponding slots and connectors (not shown) on its backside 400b to mate with transition card 118. In the chassis system 100 that is shown, a front card 108 may be inserted into appropriate slots and mated with the connectors 404. For proper insertion of the front card 108 into the slot, card guides 110 are provided. This CPCI chassis system 100 provides front removable front cards (e.g., motherboards) and unobstructed cooling across the entire set of front cards. The backplane 102 is also connected to a power supply 120 that supplies power to the CPCI system.

Figure 2:
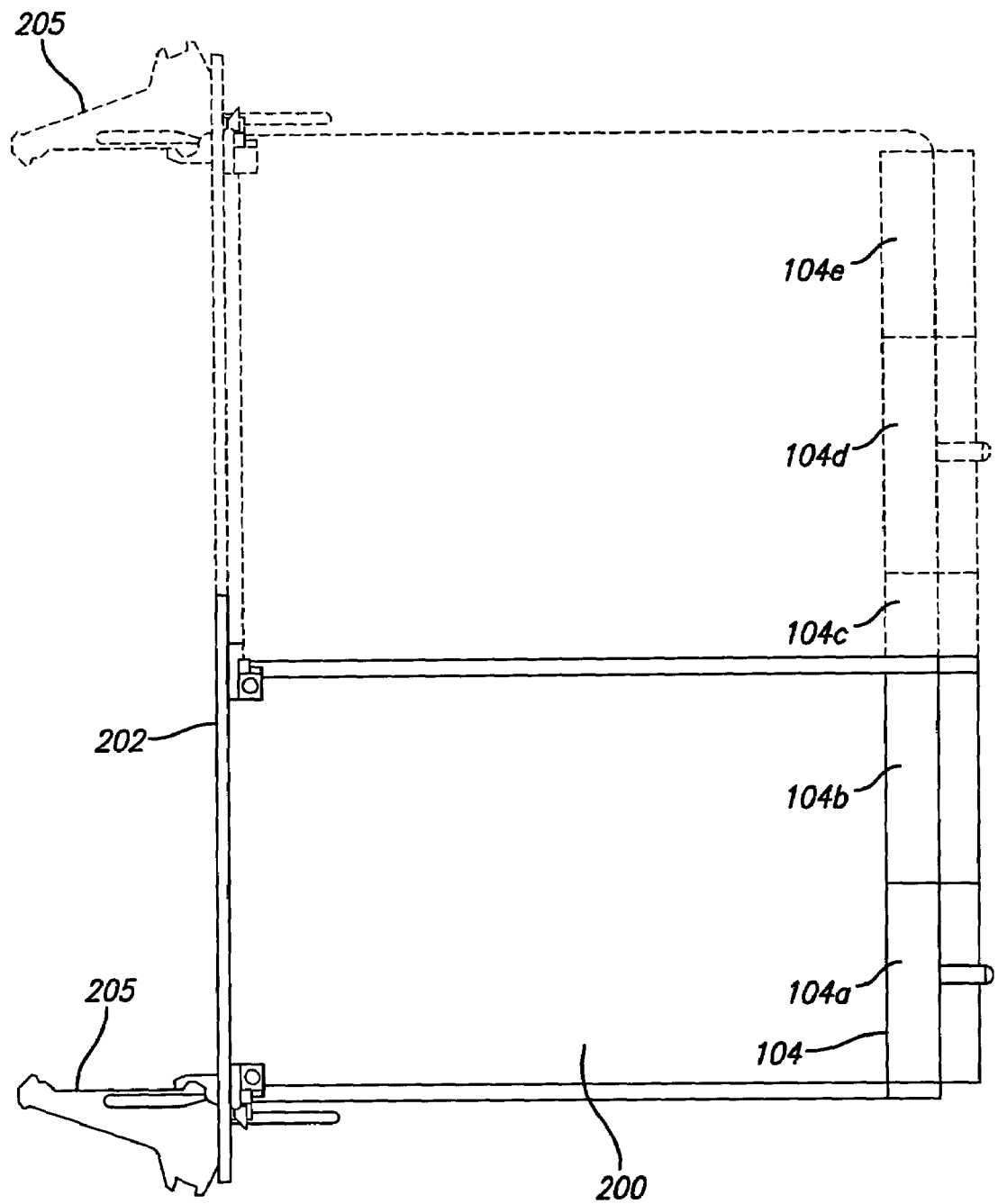
FIG. 2 shows the form factors that are defined for the CPCI node card.

Referring to FIG. 2, there are shown the form factors defined for the CPCI node card (e.g., motherboard), which is based on the PICMG CPCI industry standard (e.g., the standard in the PICMG 2.0 CPCI specification). As shown in FIG. 2, the front card 200 has a front plate interface 202 and ejector/injector handles 205. The front plate interface 202 is consistent with PICMG CPCI packaging and is compliant with IEEE 1101.1 or IEEE 1101.10. The ejector/injector handles should also be compliant with IEEE 1101.1. Two ejector/injector handles 205 are used for the 6U front cards in the present invention. The connectors 104a–104e of the front card 200 are numbered starting from the bottom connector 104a, and the 6U front card size is defined, as described below.

The dimensions of the 3U form factor are approximately 160.00 mm by approximately 100.00 mm, and the dimensions of the 6U form factor are approximately 160.00 mm by approximately 233.35 mm. The 3U form factor includes two 2 mm connectors 104a–104b and is the minimum as it accommodates the full 64 bit CPCI bus. Specifically, the 104a connectors are reserved to carry the signals required to support the 32-bit PCI bus; hence no other signals may be carried in any of the pins of this connector. Optionally, the 104a connectors may have a reserved key area that can be provided with a connector "key," which may be a pluggable piece (e.g., a pluggable plastic piece) that comes in different shapes and sizes, to restrict the add-on card to mate with an appropriately keyed slot. The 104b connectors are defined to facilitate 64-bit transfers or for rear panel I/O in the 3U form factor. The 104c–104e connectors are available for 6U systems as also shown in FIG. 2. The 6U form factor includes the two connectors 104a–104b of the 3U form factor, and three additional 2 mm connectors 104c–104e. In other words, the 3U form factor includes connectors 104a–104b, and the 6U form factor includes connectors 104a–104e. The three additional connectors 104c–104e of the 6U form factor can be used for secondary buses (i.e., Signal Computing System Architecture (SCSA) or MultiVendor Integration Protocol (MVIP) telephony buses), bridges to other buses (i.e., Virtual Machine Environment (VME) or Small Computer System Interface (SCSI)), or for user specific applications. Note that the CPCI specification defines the locations for all of the connectors 104a–104e, but only the signal-pin assignments for certain connectors are defined (e.g., the CPCI bus portions 104a and 104b are defined). The remaining connectors are the subjects of additional specification efforts or can be user defined for specific applications, as described above.

Referring to FIG. 3, there is shown a front view of a 6U backplane having eight slots. A CPCI system includes one or more CPCI bus segments, where each bus segment typically includes up to eight CPCI card slots. Each CPCI bus segment includes at least one system slot 302 and up to seven peripheral slots 304a–304g. The CPCI node card for the system slot 302 provides arbitration, clock distribution, and reset functions for the CPCI peripheral cards on the bus segment. The peripheral slots 304a–304g may contain simple cards, intelligent slaves and/or PCI bus masters.

The connectors 308a–308e have connector-pins 306 that project in a direction perpendicular to the backplane 300, and are designed to mate with the front side "active" cards ("front cards"), and "pass-through" its relevant interconnect signals to mate with the rear side "passive" input/output (I/O) card(s) ("rear transition cards"). In other words, in the conventional CPCI system, the connector-pins 306 allow the interconnected signals to pass-through from the front cards, such as the motherboards, to the rear transition cards.

Referring to FIGS. 4(a) and 4(b), there are shown respectively a front and back view of a CPCI backplane in another 6U form factor embodiment. In FIG. 4(a), four slots 402a–402d are provided on the front side 400a of the backplane 400. In FIG. 4(b), four slots 406a–406d are provided on the back side 400b of the backplane 400. Note that in both FIGS. 4(a) and 4(b) four slots are shown instead of eight slots as in FIG. 3. Further, it is important to note that each of the slots 402a–402d on the front side 400a has five connectors 404a–404e while each of the slots 406a–406d on the back side 400b has three connectors 408c–408e. This is because the 404a connectors are provided for 32 bit PCI and connector keying and the 404b connectors are typically only for I/O in the 3U form factor. Thus, in the 6U form factor they do not typically have I/O connectors to their rear. Accordingly, the front cards that are inserted in the front side slots 402a–402d only transmit signals to the rear transition cards that are inserted in the back side slots 406a–406d through front side connectors 404c–404e.

Referring to FIG. 5, there is shown a side view of the backplane of FIGS. 4(a) and 4(b). As shown in FIG. 5, slot 402d on the front side 400a and slot 406d on the back side 400b are arranged to be substantially aligned so as to be back to back. Further, slot 402c on the front side 400a and slot 406c on the backside 400b are arranged to be substantially aligned, and so on. Accordingly, the front side connectors 404c–404e are arranged back-to-back with the back side connectors 408c–408e. Note that the front side connector 404a–404b does not have a corresponding back side connector. It is important to note that the system slot 402a is adapted to receive the front card having a CPU; the signals from the system slot 402a are then transmitted to corresponding connector-pins of the peripheral slots 402b–402d. Thus, the preferred CPCI system can have expanded I/O functionality by adding peripheral front cards in the peripheral slots 402b–402d.

Figure 6:
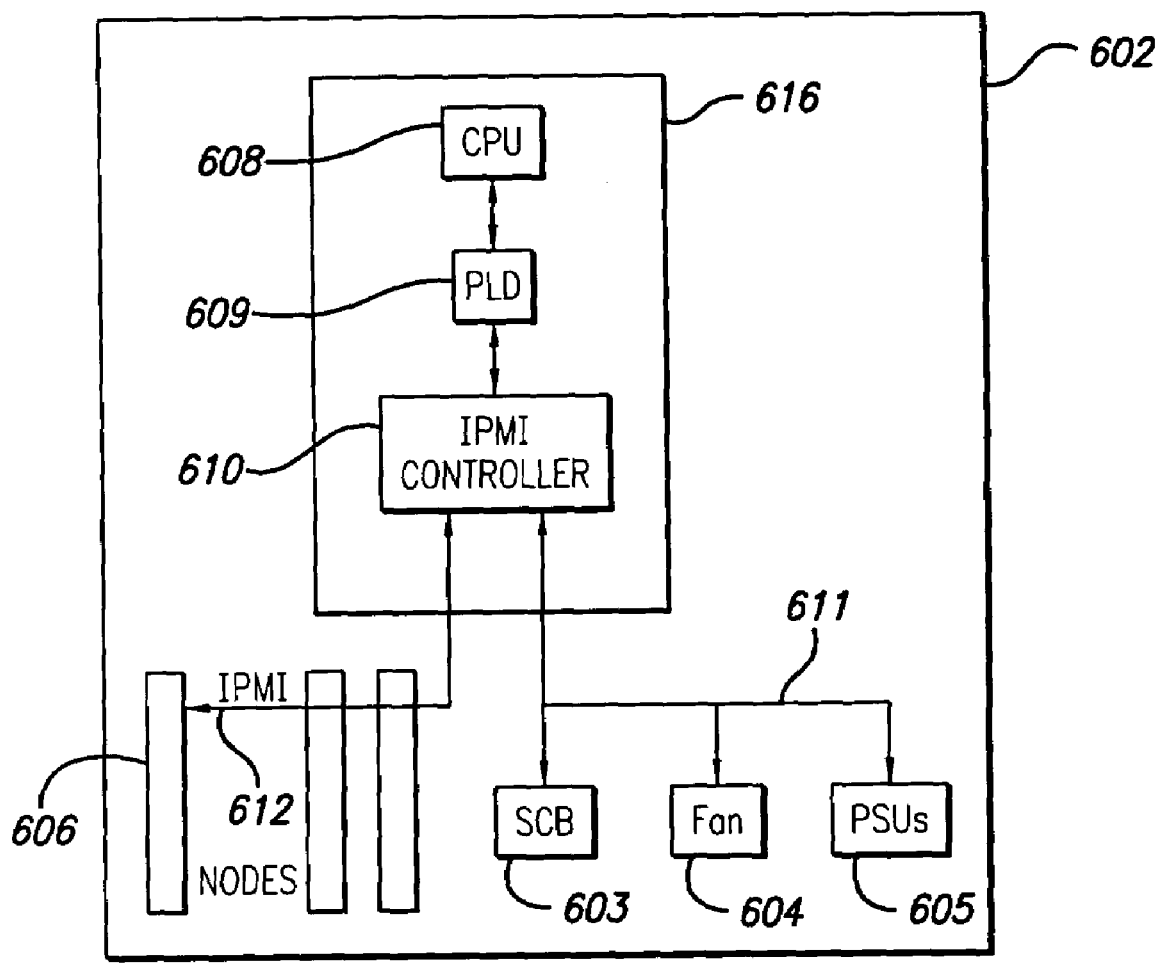
FIG. 6 shows a block diagram that illustrates a CPCI system that includes a system management card.

Referring to FIG. 6, there is shown an exemplary CPCI system 602 comprising a CPCI backplane or midplane (not shown), a plurality of node (or CPU) cards (or blades) 606, a system management card (SMC) 616, a switch card (not shown), power supplies 605, fans 604, and a system control board (SCB) 603. The SMC 616 includes a central processing unit (CPU) 608 of its own to provide the on-board intelligence for the SMC 616 and/or the system. The CPU 608 of the SMC 616 is connected to memories (not shown) containing firmware and/or software that runs on the SMC, IPMI controller 610, and other devices, such as a programmable logic device (PLD) 609 for interfacing the IPMI controller 610 with the CPU 608. The SCB 603 provides the control and status of the system 602, such as monitoring the healthy status of all the power supplies 5 and the fans 604 (Field Replaceable Units or FRUs), powering ON and OFF the FRUs, etc. The SCB 603 is interfaced with the SMC 616 via an Integrated Interconnect Circuit (I2C) bus 611 so that the SMC 616 can access and control the FRUs in the system 602. The fans 604 provide the cooling to the entire system 602. Each of the fans 604 has a fan board which provides control and status information about the fans and, like the SCB 603, are also controlled by the SMC 616 through the I2C bus 611. The power supplies 605 provide the required power for the entire system 602. The SMC 616 manages the power supplies 605 through the I2C 611 (e.g., the SMC 616 determines the status of the power supplies 605 and can power the power supplies 605 ON and OFF). The node cards 606 (like the SMC 616) are independent computing nodes and the SMC 616 manages these node cards 606 though the IPMB 612 (or IPMI).

In addition, the IPMI controller 610 has its own CPU core and runs the IPMI protocol over the IPMB or IPMI 612 to perform the management of the computing node cards 606. IPMI Controller 610 is also the central unit (or point) for the management of the system 602. The CPU 608 of the SMC 616 can control the IPMI controller 610 and retrieve the system 602 status information by interfacing with the IPMI controller 610 via an arbiter (i.e., a PLD) 609. The IPMI controller 610 provides the SMC with the IPMB (or IPMI 612) and the I2C bus 611. The IPMB or (IPMI) 612 connects with the "intelligent FRUs," such as node cards 606 and switch fabric cards (not shown) and the I2C 11 connects with the "other FRUs," such as fans 604, power supplies 605, and the SCB 603.

As previously stated, embodiments of the present invention are applicable in a Compact Peripheral Component Interconnect (CPCI) system that is adapted for the mapping of hot-swap states of a CPCI card (e.g., a PICMG 2.1 CPCI card) into a TMN plug-in unit state (e.g., OperationalState and/or AvailiableStatus states).

An embodiment of the present invention provides a method and system for mapping at least about 8 or 12 PICMG states describing the state (or status) of a hot-swap CPCI card into TMN plug-in unit states (e.g., OperationalState and/or AvailiableStatus states). The mapping utilizes a Common Operating System Library or Layer (COSL). That is, at first, the hardware/Operating System (OS) states for the CPCI card are specified in PICMG states, in accordance with the PICMG hot-swap specification. The method and system then identifies or defines (explains or interprets) the meaning (e.g., the definition, identification, function, and/or status) of the states on the CPCI card. The method and system then maps these states into intermediate states (e.g., COSL state, plug-in unit state or "plugInUnitState"). The intermediate states are then mapped into TMN plug-in unit states (e.g., OperationalState and/or AvailiableStatus). The TMN plug-in unit states corresponding to the hot-swap CPCI card will then comprise the proper identification information for the hot-swap CPCI card, such as plugInUnitType, vendorName, version, etc. Accordingly, the management ware (management software or management SW) with plug-in units based on the TMN standard can now use these mapped states to manage the state (or status) of the CPCI card.

Figure 7:
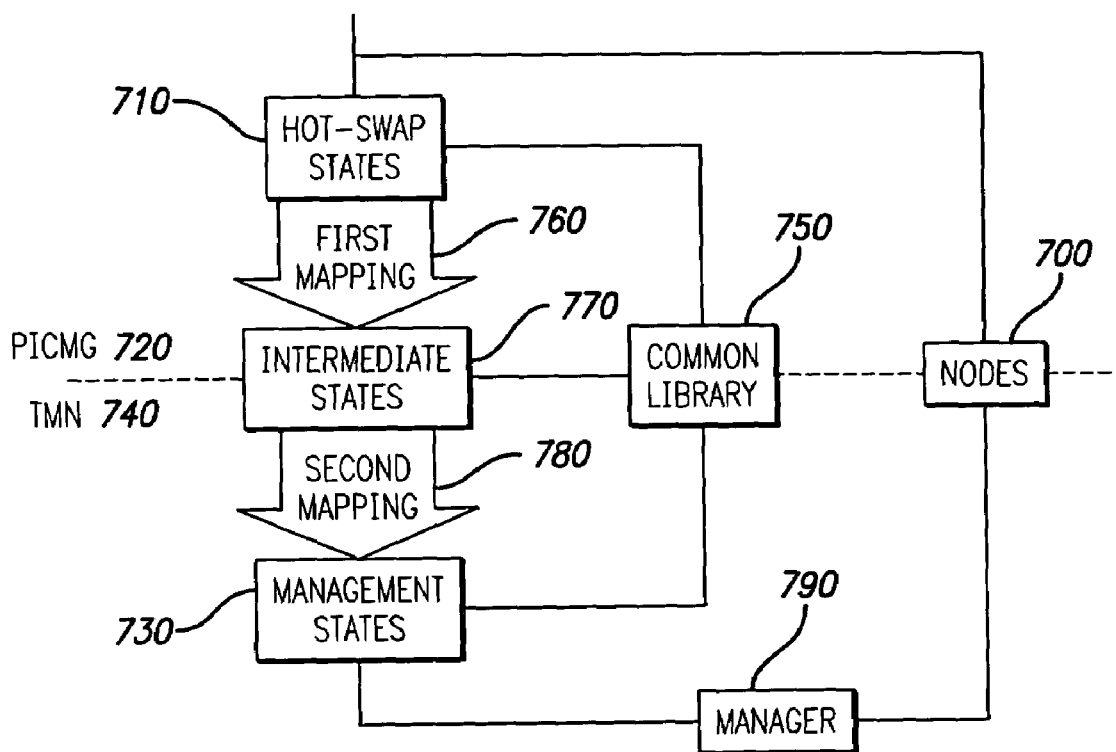
FIG. 7 shows a block diagram on mapping of hot-swap states into management states according to an embodiment of the invention.

Referring now to FIG. 7, an embodiment of the present invention provides a plurality of hot-swap states 710 for describing the state (or status) of a hot-swap CPCI node card 700 in the PICMG environment 720. The embodiment maps the hot-swap states 710 into a plurality of management states 730 in the TMN environment 740. The mapping utilizes a common library 750, such as a Common Operating System Library or Layer (COSL). In particular, the hardware/Operating System (OS) states for the CPCI node card 700 are specified in hot-swap states 710, such as PICMG states in accordance with the PICMG hot-swap specification or PICMG environment 720. The embodiment then identifies or defines (explains or interprets) the meaning (e.g., the definition, identification, function, and/or status) of the hot-swap states 710 on the CPCI node card 700. The embodiment then performs a first mapping 760 of these hot-swap states 710 into intermediate states 770 (e.g., COSL state, plug-in unit state or "plugInUnitState"). The embodiment then performs a second mapping 780 of the intermediate states 770 into management states 730, such as TMN plug-in unit states (e.g., OperationalState and/or AvailiableStatus). The management states 730 corresponding to the hot-swap CPCI node card 700 will then comprise the proper identification information for the hot-swap CPCI node card 700, such as plugInUnitType, vendorName, version, etc. Accordingly, for example, a manager 790 (e.g., management ware, management software or management SW) having plug-in units based on the TMN standard can now use these mapped states to manage the state (or status) of the CPCI node card 700.

Figure 8:
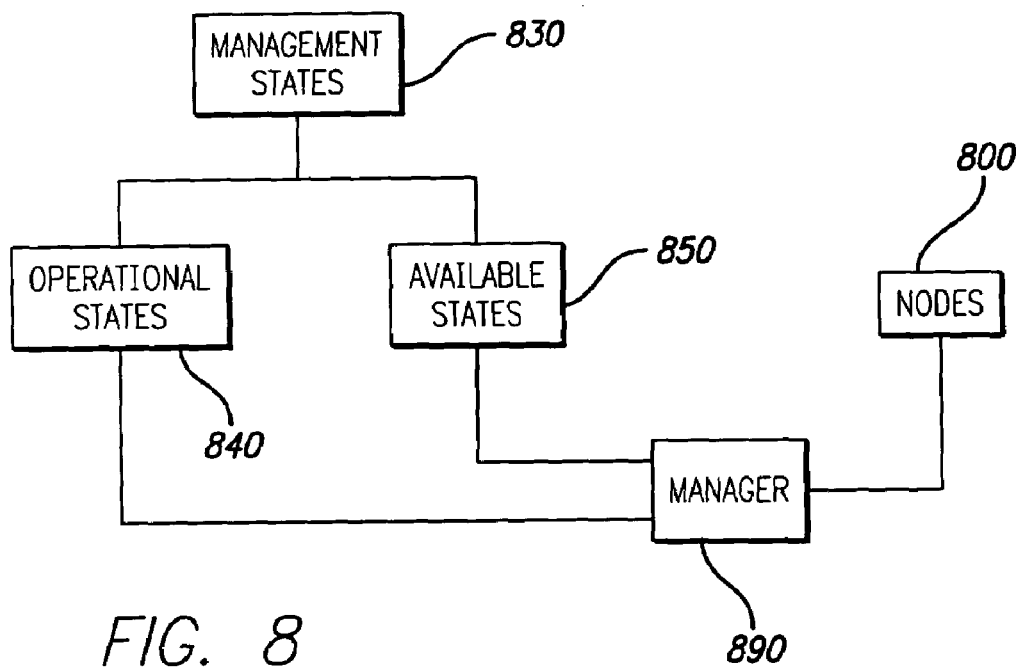
FIG. 8 shows a block diagram on a management of a CPCI node card according to an embodiment of the invention.

Referring now to FIG. 8, the management states 830 can comprise operational states 840 and availiable states 850. The operational states 840 and the available states 850 are needed by a manager 890 for the management of the CPCI cards 800. Specifically, an embodiment of the present invention is first provided with a hardware/OS state of a hot-swap CPCI card. The hardware/OS state is then mapped into a COSL plugInUnitState (an intermediate state). The COSL plugInUnitState is then mapped into two TMN (or MOH, Managed Objects Hierarchy, platform independent, and/or JAVA application) states (e.g., 840, 850). These two TMN states are OperationalState (e.g., 840) and AvaiilabilityStatus (e.g., 840) that are used by a manger (e.g., 890 or 790) to manage a CPCI node card (e.g., 800 or 700).

Having thus described embodiments of the present invention, it should be apparent to those skilled in the art that certain advantages of the described system have been achieved. It should also be appreciated that various modifications, adaptations, and alternative embodiments thereof may be made within the scope and spirit of the present invention. For example, a CPCI system has been illustrated, but it should be apparent that the inventive concepts described above would be equally applicable to other types of card arrangements, buses, motherboards, and computer systems. The invention is further defined by the following Appendix and the appended claims.

The invention claimed is:

1. A method of mapping a plurality of states for controlling hot-swappability in a Compact Peripheral Component Interconnect (CPCI) system, said method comprising:
   specifying a hot-swap state of a CPCI node card for controlling hot-swappability of said CPCI node card;
   mapping said hot-swap state onto an intermediate state by searching a common library associated with said CPCI node card and a management software for said CPCI node card; and
   mapping said intermediate state onto a first management state of said management software and a second management state of said management software;
   wherein said management software requires both said first and second management states to manage said CPCI node card.

2. The method of claim 1, further comprising:
   specifying a second hot-swap state of said CPCI node card for controlling hot-swappability of said CPCI node card;
   specifying a transition state of said CPCI node card when said CPCI node card transitions from said first hot-swap state to said second-hot swap state;
   mapping said transition state onto an intermediate transition state by searching a common library associated with said CPCI node card.

3. The method of claim 2, further comprising: notifying said management software of said intermediate transition state.

4. The method of claim 3, further comprising the step of mapping said intermediate transition state onto a third management state of said management software and a fourth management state of said management software.

5. The method of claim 4, wherein said first and third management states comprise a first operational state and a second operation state and wherein said second and fourth management states comprise a first availability state and a second availability state.

6. The method of claim 1, further comprising:
   representing said CPCI node card as a plug-in unit; and
   managing said CPCI node card as said plug-in unit by said management software upon said mapping of said intermediate state onto said first and second management states.

7. A method of mapping a plurality of states for controlling hot-swappability in a Compact Peripheral Component Interconnect (CPCI) system, said method comprising:
   specifying a PCI Industrial Computer Manufactures Group (PICMG) hot-swap state of a CPCI node card for controlling hot-swappability of said CPCI node card;
   mapping said PICMG hot-swap state onto an intermediate state by searching a common library associated with said CPCI node card and a management software for said CPCI node card; and
   mapping said intermediate state onto a Telecommunication Management Network (TMN) plug-in unit state of said management software;
   wherein said management software requires said TMN plug-in unit state to manage said CPCI node card.

8. The method of claim 7, wherein said common library comprises a Common Operating System Library (COSL) and wherein said intermediate state comprises a COSL state.

9. The method of claim 7, further comprising:
representing said CPCI node card as a TMN plug-in unit; and
managing said CPCI node card as said TMN plug-in unit by said management software upon said mapping of said intermediate state onto said TMN plug-in unit state.

10. A Compact Peripheral Component Interconnect (CPCI) system, comprising:
a CPCI chassis;
a circuit board forming a backplane within said chassis;
a CPCI node card coupled with said circuit board, said node card providing a hot-swap state;
a manager for managing said CPCI card using a first management state and a second management state;
a common library associated with said CPCI node card and said manager, said common library providing an intermediate state;
wherein said hot swap state is mapped onto said intermediate state of said common library; and
wherein said intermediate state is mapped onto said first and second management states of said manager.

11. The CPCI system of claim 10, wherein said manager requires said hot-swap state to be mapped onto said first and second management states via said intermediate state to manage said CPCI node card.

12. The CPCI system of claim 10, wherein said manager manages said CPCI node card as a plug-in unit once said hot-swap state has been mapped onto said first and second management states via said intermediate state.

13. The CPCI system of claim 12, wherein said plug-in unit comprises a Telecommunication Management Network (TMN) plug-in unit.

14. The CPCI system of claim 10, wherein said hot-swap state describes a hot-swap status of said CPCI node card.

15. The CPCI system of claim 10, wherein said first management state comprises an operational state and said second management states comprises an availability state.

16. The CPCI system of claim 15, wherein said operational state comprises one of a null-operational state, an up-operational state, a down-operational state, and an unknown-operational state.

17. The CPCI system of claim 15, wherein said availability state comprises one of a null-availability state, a power-off-availability state, an offline-availability state, an available-availability state, a failed-availability state, and an unknown-availability state.

18. The CPCI system of claim 10, wherein said intermediate state comprises one of a no plug-in state, a first power-off state, a second power-off state, a first unavailable-state, a second unavailable-state, an available state, a failed state, and an unknown state.

19. The CPCI system of claim 10, wherein said hot-swap state comprises a plurality of states for indicating plug-in status.

20. The CPCI system of claim 10, wherein said hot-swap state comprises one of:
a first state for indicating a plug-in unit is present, but not powered on;
a second state for indicating a plug-in unit is powered up, but not connected;
a third state for indicating a plug-in unit is connected;
a fourth state for indicating a plug-in unit is configured, but drivers are not loaded and associated;
a fifth state for indicating a plug-in unit is configured and drivers are loaded and associated;
a sixth state for indicating a plug-in unit is in use; and
two failed states.

21. The CPCI system of claim 10, wherein said manager comprises a management software having plug-in units based on Telecommunication Management Network (TMN) standard.

22. The CPCI system of claim 21, wherein said hot-swap state comprises a state based on a PCI Industrial Computer Manufactures Group (PICMG) hot-swap/High Availability (HA) specification.

23. The CPCI system of claim 22, wherein said management software manages said CPCI node card as a TMN plug-in unit and requires said hot-swap state to be mapped onto said first and second management states via said intermediate state in order to manage said CPCI node card as said TMN plug-in unit.

* * * * *